(12) United States Patent
Chen et al.

(10) Patent No.: US 8,455,971 B2
(45) Date of Patent: Jun. 4, 2013

(54) APPARATUS AND METHOD FOR IMPROVING CHARGE TRANSFER IN BACKSIDE ILLUMINATED IMAGE SENSOR

(75) Inventors: Szu-Ying Chen, Taichung (TW); Pao-Tung Chen, Tainan Hsien (TW); Dun-Nian Yaung, Taipei (TW); Jen-Cheng Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 193 days.

(21) Appl. No.: 13/026,994

(22) Filed: Feb. 14, 2011

(65) Prior Publication Data
US 2012/0205730 A1    Aug. 16, 2012

(51) Int. Cl.
*H01L 27/146* (2006.01)
(52) U.S. Cl.
USPC ............. 257/444; 257/432; 257/431; 438/57; 438/48
(58) Field of Classification Search .......... 257/290–294, 257/444, 432, 431; 438/57, 48
See application file for complete search history.

(56) References Cited

U.S. PATENT DOCUMENTS

| 7,078,746 | B2 | 7/2006 | Hong |
| 2005/0205879 | A1* | 9/2005 | Fukunaga ........................ 257/80 |
| 2009/0200624 | A1 | 8/2009 | Dai et al. |
| 2009/0201393 | A1 | 8/2009 | Tai et al. |
| 2010/0102411 | A1 | 4/2010 | Hsu et al. |
| 2010/0140675 | A1 | 6/2010 | Rhodes |
| 2010/0164042 | A1* | 7/2010 | Manabe ........................ 257/437 |
| 2010/0176276 | A1 | 7/2010 | Ihara |

FOREIGN PATENT DOCUMENTS
WO    WO-2005/041304 A2    6/2005

* cited by examiner

*Primary Examiner* — Eva Y Montalvo
(74) *Attorney, Agent, or Firm* — Haynes and Boone, LLP

(57) ABSTRACT

The present disclosure provides an image sensor device and a method of forming the image sensor device. In an example, an image sensor device includes a substrate having a front surface and a back surface; a sensor element disposed at the front surface of the substrate, the sensor element being operable to sense radiation projected toward the back surface of the substrate; and a transparent conductive layer disposed over the back surface of the substrate, the transparent conductive layer at least partially overlying the sensor element. The transparent conductive layer is configured for being electrically coupled to a bottom portion of the sensor element.

20 Claims, 11 Drawing Sheets

APPARATUS AND METHOD FOR IMPROVING CHARGE TRANSFER IN BACKSIDE ILLUMINATED IMAGE SENSOR

BACKGROUND

Integrated circuit (IC) technologies are constantly being improved. Such improvements frequently involve scaling down device geometries to achieve lower fabrication costs, higher device integration density, higher speeds, and better performance. Along with the advantages realized from reducing geometry size, improvements are being made directly to the IC devices. One such IC device is an image sensor device. An image sensor device includes a pixel array (or grid) for detecting light and recording an intensity (brightness) of the detected light. The pixel array responds to the light by accumulating a charge—the more light, the higher the charge. The charge can then be used (for example, by other circuitry) to provide a color and brightness that can be used for a suitable application, such as a digital camera. Common types of pixel grids include a charge-coupled device (CCD) image sensor or complimentary metal-oxide-semiconductor (CMOS) image sensor device.

One type of image sensor device is a backside illuminated (BSI) image sensor device. BSI image sensor devices are used for sensing a volume of light projected towards a backside surface of a substrate (which supports the image sensor circuitry of the BSI image sensor device). The pixel grid is located at a front side of the substrate, and the substrate is thin enough so that light projected towards the backside of the substrate can reach the pixel grid. BSI image sensor devices provide a high fill factor and reduced destructive interference, as compared to front-side illuminated (FSI) image sensor devices. However, due to device scaling, improvements to BSI technology are continually being made to further improve BSI image sensor device quantum efficiency. Accordingly, although existing BSI image sensor devices and methods of fabricating these BSI image sensor devices have been generally adequate for their intended purposes, as device scaling down continues, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
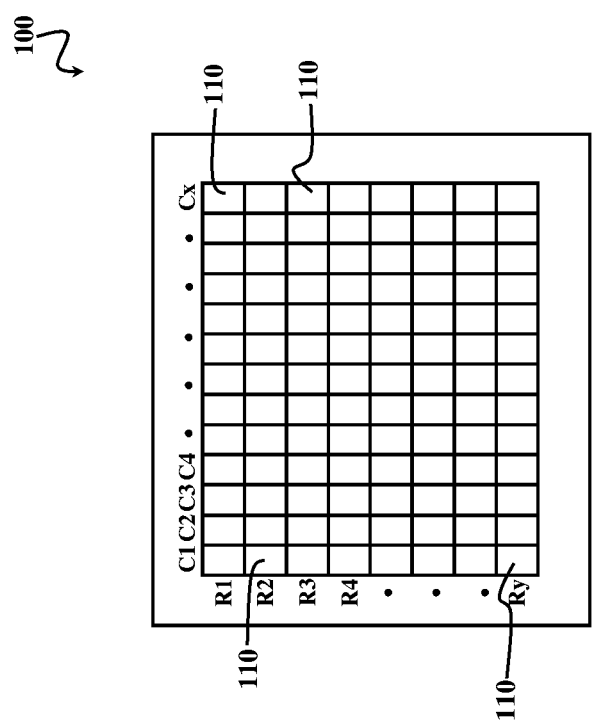
FIG. 1 is a top view of an image sensor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a top view of an image sensor device 100 according to various aspects of the present disclosure. In the depicted embodiment, the image sensor device is a backside illuminated (BSI) image sensor device. The image sensor device 100 includes an array of pixels 110. Each pixel 110 is arranged into a column (for example, C1 to Cx) and a row (for example, R1 to Ry). The term "pixel" refers to a unit cell containing features (for example, a photodetector and various circuitry, which may include various semiconductor devices) for converting electromagnetic radiation to an electrical signal. The pixels 110 may include photodiodes, complimentary metal-oxide-semiconductor (CMOS) image sensors, charged coupling device (CCD) sensors, active sensors, passive sensors, and/or other sensors. As such, the pixels 110 may comprise conventional and/or future-developed image sensing devices. The pixels 110 may be designed having various sensor types. For example, one group of pixels 110 may be CMOS image sensors and another group of pixels 110 may be passive sensors. Moreover, the pixels 110 may include color image sensors and/or monochromatic image sensors. In an example, each pixel 110 is an active pixel sensor, such as a complimentary metal-oxide-semiconductor (CMOS) imaging pixel. In the depicted embodiment, each pixel 110 may include a photodetector, such as a photogate-type photodetector, for recording an intensity or brightness of light (radiation). Each pixel 110 may also include various semiconductor devices, such as various transistors including a transfer transistor, a reset transistor, a source-follower transistor, a select transistor, other suitable transistor, or combinations thereof. Additional circuitry, input, and/or outputs may be coupled to the pixel array to provide an operation environment for the pixels 110 and support external communications with the pixels 110. For example, the pixel array may be coupled with readout circuitry and/or control circuitry. For simplicity, image sensor devices including a single pixel are described in the present disclosure; however, typically an array of such pixels may form the image sensor device 100 illustrated in FIG. 1.

Figure 2:
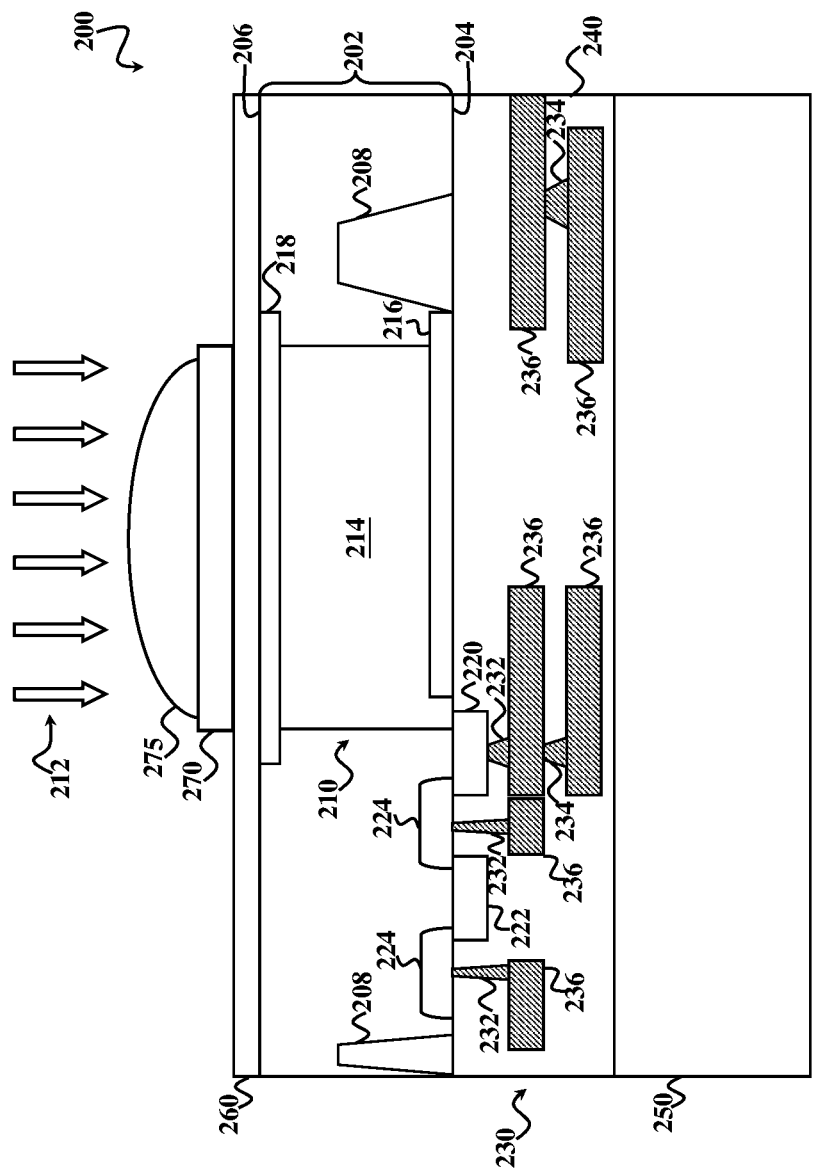
FIG. 2 is a diagrammatic sectional side view of an integrated circuit device including a sensor element according to various aspects of the present disclosure.

FIG. 2 is a diagrammatic sectional side view of an embodiment of an integrated circuit device 200 according to various aspects of the present disclosure. In the depicted embodiment, integrated circuit device 200 includes a backside illuminated (BSI) image sensor device. The integrated circuit device 200 may include an integrated circuit (IC) chip, system on chip (SoC), or portion thereof, that includes various passive and active microelectronic components, such as resistors, capacitors, inductors, diodes, metal-oxide-semiconductor field effect transistors (MOSFET), complementary MOS (CMOS) transistors, bipolar junction transistors (BJT), laterally diffused MOS (LDMOS) transistors, high power MOS transistors, fin-like field effect transistors (FinFET), other suitable components, or combinations thereof. FIG. 2 has been simplified for the sake of clarity to better understand the inventive concepts of the present disclosure. Additional features can be added in the integrated circuit device 200, and some of the features described below can be replaced or eliminated for other embodiments of the integrated circuit device 200.

The integrated circuit device 200 includes a substrate 202 having a front surface 204 and a back surface 206. In the depicted embodiment, the substrate 202 is a semiconductor substrate including silicon. Alternatively or additionally, the substrate 202 includes another elementary semiconductor, such as germanium and/or diamond; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 202 may be a semiconductor on insulator (SOI). The substrate 202 may include a doped epi layer, a gradient semiconductor layer, and/or a semiconductor layer overlying another semiconductor layer of a different type, such as a silicon layer on a silicon germanium layer.

The substrate may be a p-type or an n-type substrate depending on design requirements of the integrated circuit device 200. In the depicted embodiment, the substrate 202 is a p-type substrate. P-type dopants that the substrate 202 are doped with include boron, gallium, indium, other suitable p-type dopants, or combinations thereof. Because the depicted integrated circuit device 200 includes a p-type doped substrate, doping configurations described below should be read consistent with a p-type doped substrate. The integrated circuit device 200 may alternatively include an n-type doped substrate, in which case, the doping configurations described below should be read consistent with an n-type doped substrate (for example, read with doping configurations having an opposite conductivity). N-type dopants that the substrate 202 can be doped with include phosphorus, arsenic, other suitable n-type dopants, or combinations thereof. The p-type substrate 202 may include various p-type doped regions and/ or n-type doped regions. Doping may be implemented using a process such as ion implantation or diffusion in various steps and techniques.

The substrate 202 includes isolation features 208, such as local oxidation of silicon (LOCOS) and/or shallow trench isolation (STI), to separate (or isolate) various regions and/or devices formed on or within the substrate 202. For example, the isolation features 208 isolate a sensor element 210 from adjacent sensor elements. In the depicted embodiment, the isolation features 208 are STIs. The isolation features 208 include silicon oxide, silicon nitride, silicon oxynitride, other suitable materials, or combinations thereof. The isolation features 208 are formed by any suitable process. For example, forming an STI includes a photolithography process, etching a trench in the substrate (for example, by using a dry etching and/or wet etching), and filling the trench (for example, by using a chemical vapor deposition process) with dielectric material. The filled trench may have a multi-layer structure, such as a thermal oxide liner layer filled with silicon nitride or silicon oxide.

As noted above, the integrated circuit device 200 includes the sensor element (or sensor pixel) 210. The sensor element 210 detects an intensity (brightness) of radiation, such as incident radiation (light) 212, directed toward the back surface 206 of the substrate 202. In the depicted embodiment, the incident radiation 212 is visual light. Alternatively, the radiation 212 could be infrared (IR), ultraviolet (UV), X-ray, microwave, other suitable radiation type, or combinations thereof. The sensor element 210 may be configured to correspond with a specific light wavelength, such as a red, a green, or a blue light wavelength. In other words, the sensor element 210 may be configured to detect an intensity (brightness) of a particular light wavelength. In the depicted embodiment, the sensor element 210 is a pixel, which may be in a pixel array, such as the pixel array illustrated in FIG. 1.

In the depicted embodiment, the sensor element 210 includes a photodetector, such as a photodiode, that includes a light-sensing region (or photo-sensing region) 214, a pinned layer 216, and a pinned layer 218. The light-sensing region (or photo-sensing region) 214 is a doped region having n-type and/or p-type dopants formed in the substrate 202, specifically along the front surface 204 of the substrate 202. In the depicted embodiment, the light-sensing region 214 is an n-type doped region. The light-sensing region 214 is formed by a method such as diffusion and/or ion implantation. The pinned layers 216 and 218 are disposed in the substrate 202, such that the light-sensing region 214 is disposed between the pinned layer 216 and the pinned layer 218. The pinned layer 216 is disposed at the front surface 204 of the substrate 202, and the pinned layer 218 is disposed at the back surface 206 of the substrate 202. The pinned layers 216 and 218 are doped layers. For example, in the depicted embodiment, the pinned layers 216 and 218 are p-type implanted layers. The sensor element 210 further includes various transistors, such as a transfer transistor associated with a transfer gate 220, a reset transistor associated with a reset gate 222, a source-follower transistor (not illustrated), a select transistor (not illustrated), other suitable transistors, or combinations thereof. The light-sensing region 214 and various transistors (which can collectively be referred to as pixel circuitry) allow the sensor element 210 to detect intensity of the particular light wavelength. Additional circuitry, input, and/or outputs may be provided to the sensor element 210 to provide an operation environment for the sensor element 210 and/or support communication with the sensor element 210.

The transfer gate 220 and the reset gate 222 are disposed over the front surface 204 of the substrate 202. The transfer gate 220 interposes a source/drain region 224 of the substrate 202 and the light-sensing region 214, such that a channel is defined between the source/drain region 224 and the light-sensing region 214. The reset gate 222 interposes source/drain regions 224 of the substrate 202, such that a channel is defined between two source/drain regions 224. In the depicted embodiment, the source/drain regions 224 are N+ source/drain diffusion regions. The source/drain regions 224 may be referred to as floating diffusion regions.

The transfer gate 220 and reset gate 222 may include a gate stack having a gate dielectric layer and a gate electrode. The gate dielectric layer includes a dielectric material, such as silicon oxide, high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. The gate electrode includes polysilicon and/or a metal including Al, Cu, Ti, Ta, W, Mo, TaN, NiSi, CoSi, TiN, WN, TiAl, TiAlN, TaCN, TaC, TaSiN, other conductive materials, or combinations thereof. The gate stacks may include numerous other layers, for example, capping layers, interface layers, diffusion layers, barrier layers, or combinations thereof. The transfer gate 220 and reset gate 222 may include spacers disposed on the sidewalls of the gate stacks. The spacers include a dielectric material, such as silicon nitride, silicon oxynitride, other suitable material, or combinations thereof. The spacers may include a multi-layer structure, such as a multi-layer structure including a silicon nitride layer and a silicon oxide layer. The gates 220 and 222 are formed by a suitable process, including deposition, lithography patterning, and etching processes.

The integrated circuit device 200 further includes a multi-layer interconnect (MLI) 230 disposed over the front surface 204 of the substrate 202, including over the sensor element 210. The MLI 230 is coupled to various components of the BSI image sensor device, such as the sensor element 220, such that the various components of the BSI image sensor device are operable to properly respond to illuminated light (imaging radiation). The MLI 230 includes various conductive features, which may be vertical interconnects, such as contacts 232 and/or vias 234, and/or horizontal interconnects, such as lines 236. The various conductive features 232, 234, and 236 may include conductive materials, such as metal. In an example, metals including aluminum, aluminum/silicon/copper alloy, titanium, titanium nitride, tungsten, polysilicon, metal silicide, or combinations thereof, may be used, and the various conductive features 232, 234, and 236 may be referred to as aluminum interconnects. Aluminum interconnects may be formed by a process including physical vapor deposition (PVD), chemical vapor deposition (CVD), or combinations thereof. Other manufacturing techniques to form the various conductive features 232, 234, and 236 may include photolithography processing and etching to pattern conductive materials to form the vertical and horizontal connects. Still other manufacturing processes may be implemented to form the MLI 230, such as a thermal annealing to form metal silicide. The metal silicide used in multilayer interconnects may include nickel silicide, cobalt silicide, tungsten silicide, tantalum silicide, titanium silicide, platinum silicide, erbium silicide, palladium silicide, or combinations thereof. Alternatively, the various conductive features 232, 234, and 236 may be copper multilayer interconnects, which include copper, copper alloy, titanium, titanium nitride, tantalum, tantalum nitride, tungsten, polysilicon, metal silicide, or combinations thereof. The copper interconnects may be formed by a process including PVD, CVD, or combinations thereof. It is understood that the MLI 230 is not limited by the number, material, size, and/or dimension of the conductive features 232, 234, 336 depicted, and thus, the MLI 230 may include any number, material, size, and/or dimension of conductive features depending on design requirements of the integrated circuit device 200.

The various conductive features 232, 234, and 236 of the MLI 230 are disposed in an interlayer (or inter-level) dielectric (ILD) layer 240. The ILD layer 240 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other suitable materials, or combinations thereof. The ILD layer 240 may have a multilayer structure. The ILD layer 240 may be formed by a technique including spin-on coating, CVD, sputtering, or other suitable processes. In an example, the MLI 230 and ILD 240 may be formed in an integrated process including a damascene process, such as a dual damascene process or single damascene process.

A carrier wafer 250 is disposed over the front surface 204 of the substrate 202. In the depicted embodiment, the carrier wafer 250 is bonded to the MLI 230. The carrier wafer 250 comprises silicon. Alternatively, the carrier wafer 250 comprises another suitable material, such as glass. The carrier wafer 250 provides protection for the various features (such as the sensor element 210) formed on the front surface 204 of the substrate 202, and also provides mechanical strength and support for processing the backside surface 206 of the substrate 202.

The integrated circuit device 200 further includes features disposed over the back surface 206 of the substrate 202. In the depicted embodiment, the integrated circuit device 200 includes an antireflective layer 260, a color filter 270, and a lens 275 disposed over the back surface 206 of the substrate 202. The antireflective layer 260 is disposed between the back surface 206 of the substrate 202 and the color filter 270. The antireflective layer 260 includes a dielectric material, such as silicon nitride or silicon oxynitride.

The color filter 270, disposed over the back surface 206 of the substrate 202, is aligned with the light-sensing region 214 of the sensor element 210. In the depicted embodiment, the color filter 270 is disposed over the antireflective layer 260. The color filter 270 is designed so that it filters through light of a predetermined wavelength. For example, the color filter 270 may filter through visible light of a red wavelength, a green wavelength, or a blue wavelength to the sensor element 210. The color filter 270 includes any suitable material. In an example, the color filter 270 includes a dye-based (or pigment-based) polymer for filtering out a specific frequency band (for example, a desired wavelength of light). Alternatively, the color filter 270 could include a resin or other organic-based material having color pigments.

The lens 275, disposed over the back surface 206 of the substrate 202, is also aligned with the light-sensing region 214 of the sensor element 210. In the depicted embodiment, the lens 275 is disposed over the color filter 270. The lens 275 may be in various positional arrangements with the sensor element 210 and color filter 270, such that the lens 275 focuses the incident radiation 212 on the light sensing region 214 of the sensor element 210. The lens 275 includes a suitable material, and may have a variety of shapes and sizes depending on an index of refraction of the material used for the lens and/or a distance between the lens and sensor element 210. Alternatively, the position of the color filter layer 270 and lens layer 275 may be reversed, such that the lens 275 is disposed between the antireflective layer 260 and color filter 270. The present disclosure also contemplates the integrated circuit device 200 having a color filter layer disposed between lens layers.

In operation, the integrated circuit device 200 is designed to receive radiation 212 traveling towards the back surface 206 of the substrate 202. The lens layer 275 directs the incident radiation 212 to the color filter 270. The light then passes from the color filter 270 through the antireflective layer 260 to the substrate 202 and corresponding sensor element 210, specifically to the light sensing region 214. Light passing through to the color filter 270 and sensor element 210 may be maximized since the light is not obstructed by various device features (for example, gates electrodes) and/or metal features (for example, the conductive features 232, 234, and 236 of the MLI 230) overlying the front surface 204 of the substrate 202. The desired wavelength of light (for example, red, green, and blue light) that is allowed to pass through to the light-sensing region 214 of the sensor element 210. When exposed to the light, the light-sensing region 214 of the sensor element 210 produces and accumulates (collects) electrons as long as the transfer transistor associated with transfer gate 220 is in an "off" state. When the transfer gate 220 is in an "on" state, the accumulated electrons (charge) can transfer to the source/drain region (floating diffusion region) 224. A source-follower transistor (not illustrated) may convert the charge to voltage signals. Prior to charge transfer, the source/drain regions 224 may be set to a predetermined voltage by turning on the reset transistor associated with reset gate 222. In the depicted embodiment, the pinned layers 216 and 218 may have a same potential, such as a potential of the substrate 202, such that the light-sensing region 214 is fully depleted at a pinning voltage ($V_{PIN}$) and a potential of the sensor element 210 is pinned to a constant value, $V_{PIN}$, when the light-sensing region 214 is fully depleted. Further, the pinned layer 218 along the back surface 206 of the substrate 202 may reduce various defects of the substrate 202 where the light-sensing region 214 is formed, thereby reducing dark current and/or white pixel generation.

Figure 3:
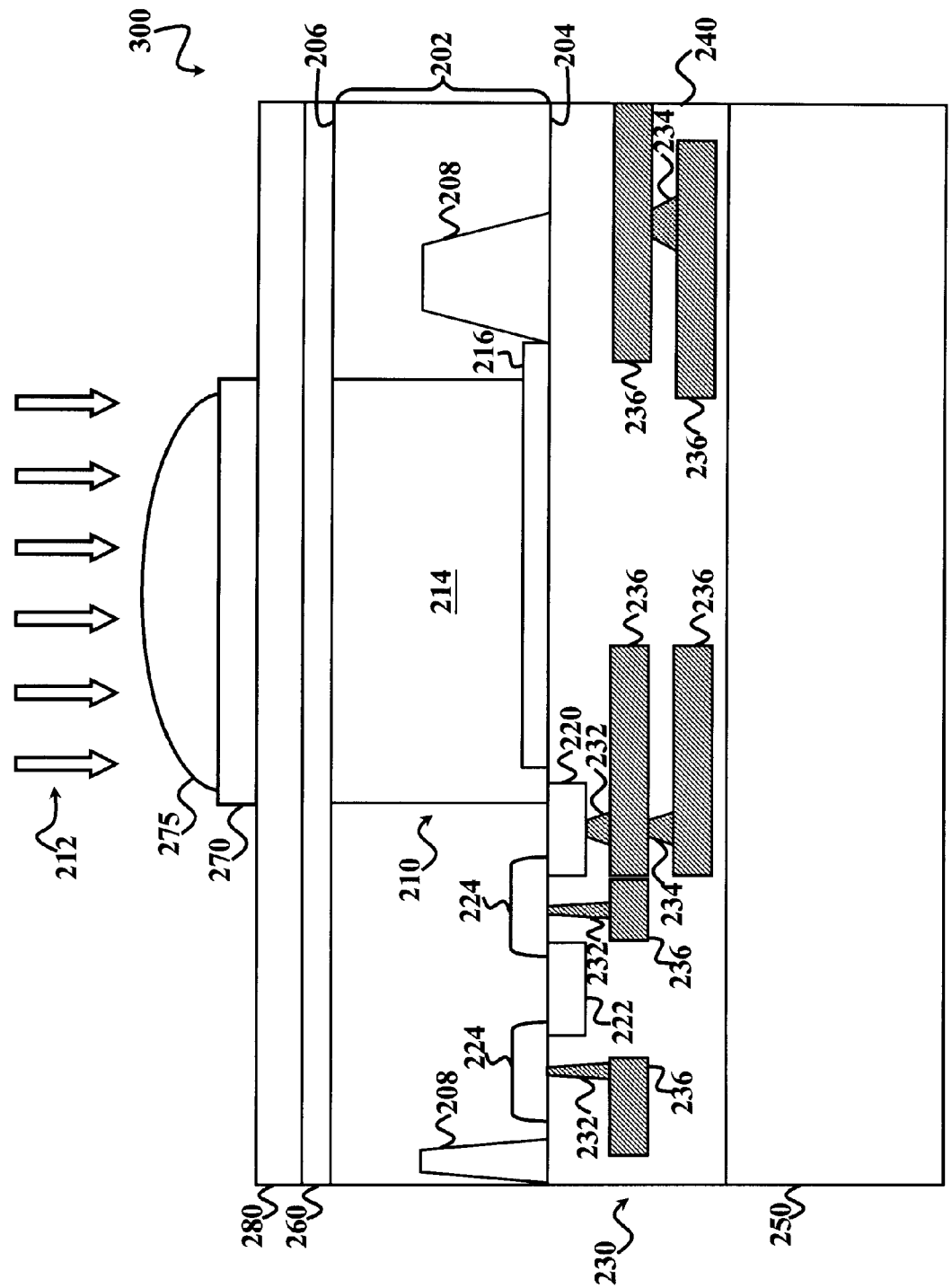
FIG. 3 is a diagrammatic sectional side view of another integrated circuit device including a sensor element according to various aspects of the present disclosure.

FIG. 3 is a diagrammatic sectional side view of an integrated circuit device 300 that is an alternative embodiment of the integrated circuit device 200 of FIG. 2. The embodiment of FIG. 3 is similar in many respects to the embodiment of FIG. 2. For example, in the depicted embodiment, the integrated circuit device 300 includes a BSI image sensor device. Accordingly, similar features in FIGS. 2 and 3 are identified by the same reference numerals for clarity and simplicity. FIG. 3 has been simplified for the sake of clarity to better understand the inventive concepts of the present disclosure. Additional features can be added in the integrated circuit device 300, and some of the features described below can be replaced or eliminated for other embodiments of the integrated circuit device 300.

In contrast to the integrated circuit device 200 of FIG. 2, the integrated circuit device 300 is free of the pinned layer 218, and further includes a transparent conductive layer 280 disposed over the back surface 206 of the substrate 202. In the depicted embodiment, the transparent conductive layer 280 is disposed between the antireflective (dielectric) layer 260 and color filter 270/lens 275. The transparent conductive layer 280 is substantially transparent and substantially conductive. The degree of transparency and degree of conductivity of the transparent conductive layer 280 may be measured by a transmission rate of radiation in a visible spectrum and sheet resistance, respectively. In an example, the transparent conductive layer 280 includes an indium tin oxide (ITO) material. In another example, the transparent conductive layer 280 includes an indium gallium zinc oxide (IGZO) material. The transparent conductive layer 280 may include other suitable materials, such as a fluorine zinc oxide (FZO) material and/or aluminum zinc oxide (AZO) material, including combinations of various transparent conductive materials. In another example, the transparent conductive layer has a transmission rate of radiation in a visible spectrum that is greater than or equal to about 80%, and/or a resistivity that is less than or equal to about $1\times10^{-4}$ ohm centimeters. In the depicted embodiment, the antireflective layer 260 has a thickness of about 100 Å to about 1,000 Å, and the transparent conductive layer 280 has a thickness of about 100 nm to about 300 nm.

The transparent conductive layer 280 is capacitively coupled to the sensor element 210. The transparent conductive layer 280 may thus provide a naturally high potential for signal charge at the back surface 206 of the substrate 202, particularly at the back surface 206 of the substrate 202 aligned with the light-sensing region 214 of the sensor element 210. This can eliminate the need for the pinned layer 218 at the back surface 206 of the substrate 202, which is provided in the sensor element 210 in the integrated circuit device 200 of FIG. 2. In an example, the transparent conductive layer 280 is configured such that it is electrically coupled with the sensor element 210. More specifically, the transparent conductive layer 280 is configured such that it is electrically coupled with a bottom portion of the light-sensing region 214 (in other words, a portion of the light-sensing region 214 closest to the back surface 206 of the substrate 202). The electrical coupling can enhance an electric field at the bottom portion of the sensor element 210, which improves charge transfer ability. Though a thicker substrate 202 may be used, for example in the integrated circuit device 200 of FIG. 2, to improve quantum efficiency of longer wavelengths (where a visible radiation region is from about 0.4 μm to about 0.6 μm and an absorption length is about 0.1 μm to about 10 μm), the integrated circuit device 200 of FIG. 2 provides sufficiently less electrical force than desired to transfer electrons generated in the substrate 202 (in the depicted embodiment, a silicon substrate) to the transfer gate 220 (and ultimately, the source/drain region 224). In contrast, the integrated circuit device 300 includes the transparent conductive layer 280, which can replace the pinned layer 218 at the back surface 206 of the substrate 202 in integrated circuit device 200, and provide naturally high potential to improve charge transferring ability.

Figure 4A:
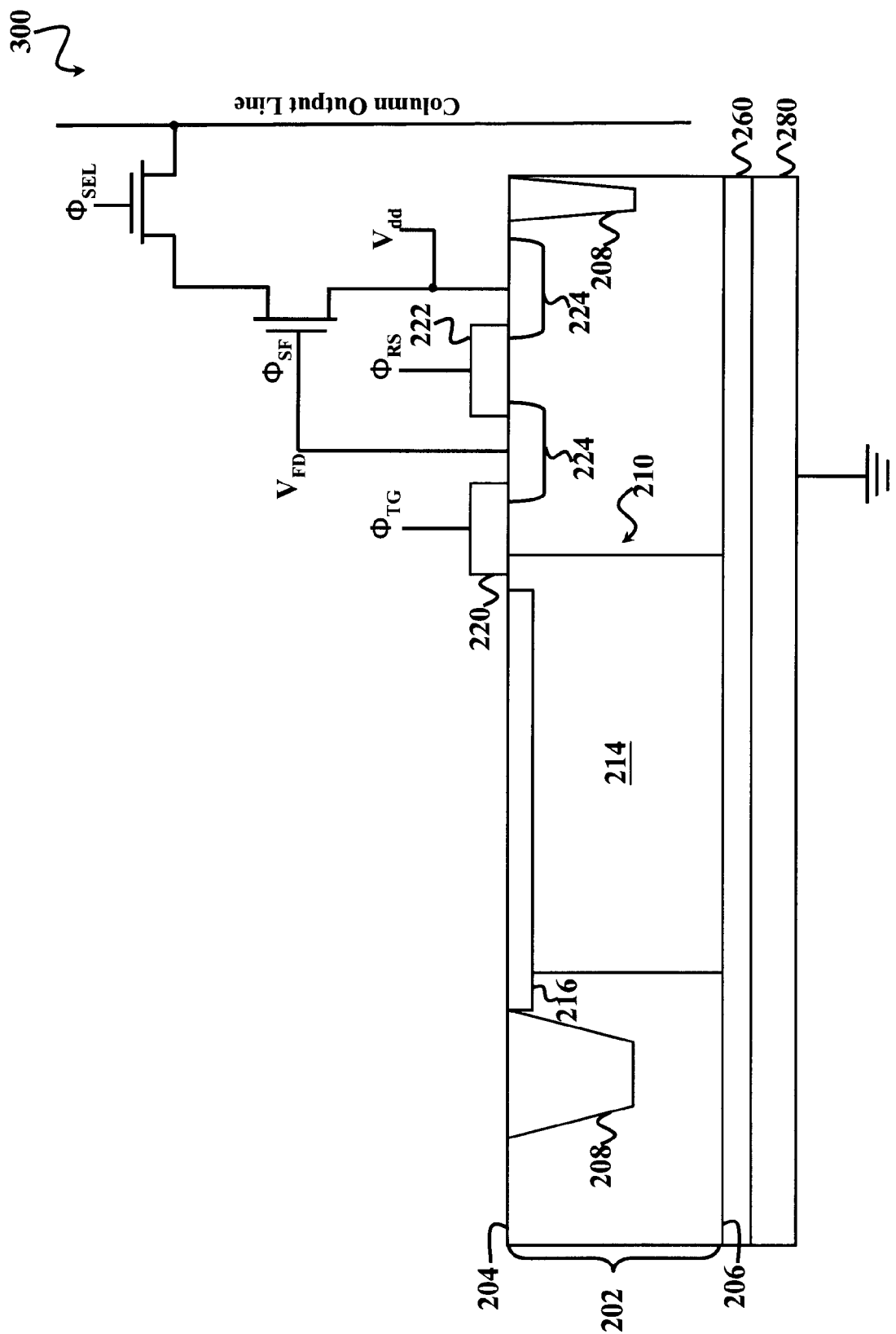
FIGS. 4A-4C and FIGS. 5A-5C illustrate the sensor element of the integrated circuit device of FIG. 3 in various operational states according to various aspects of the present disclosure.
Figure 4B:
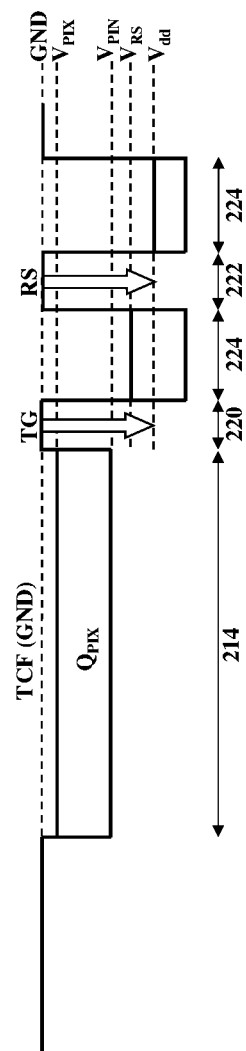
Figure 4C:
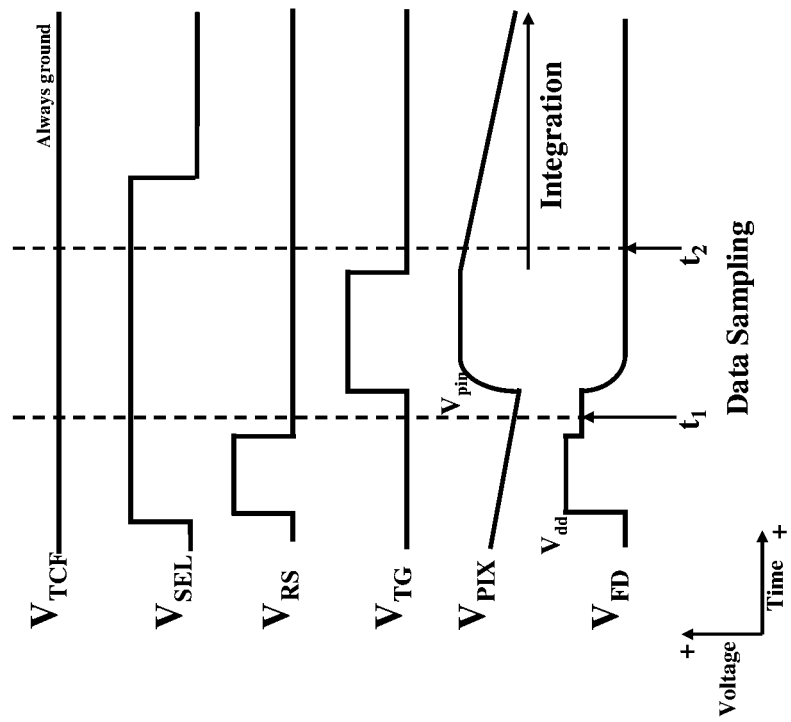

In operation, the transparent conductive layer 280 of the integrated circuit device 300 may be grounded or biased to achieve various operation states for the sensor element 210. FIGS. 4A-4C illustrate an operation approach of the sensor element 210 of the integrated circuit device 300 where the transparent conductive layer 280 is grounded. FIG. 4A is a hybrid diagrammatic sectional side view/circuit diagram of the integrated circuit device 300 according to various aspects of the present disclosure. FIG. 4B is a potential diagram of the sensor element 210 during an integration period (when the light-sensing region 214 is accumulating charge) when transparent conductive layer 280 is grounded during operation, and FIG. 4C is a timing diagram of the operation of the sensor element 210 when transparent conductive layer 280 is grounded during operation.

In FIG. 4A, the integrated circuit device 300 has been flipped, such that the front surface 204 is on the top and the back surface 206 is on the bottom. Various features of the substrate 202 have been omitted for the sake of clarity to better understand the inventive concepts of the present disclosure. For example, the MLI 230, ILD 240, color filter 270, and lens 275 are not illustrated in FIG. 4A. In the depicted embodiment, the integrated circuit device 300 includes the transfer transistor (TG) associated with transfer gate 220, the reset transistor (RS) associated with the reset gate 222, a source-follower transistor (SF), and a select transistor (SEL). The source/drain region 224 disposed between the transfer gate 220 and the reset gate 222 is a floating diffusion (FD) node. The FD node (one of the source/drain regions 224 of the reset transistor and transfer transistor) is coupled with a gate of the source-follower transistor, and the other source/drain region 224 of the reset transistor is coupled with a source-follower source/drain. Another source-follower source/drain is coupled to a select transistor source/drain, and another select transistor source/drain is coupled to a column output line (column bus).

During operation, referring to FIGS. 4A-4C, the transparent conductive layer 280 is grounded (GND). The reset transistor is coupled between a power rail ($V_{dd}$) and the floating diffusion (FD) node (source/drain region 224), which has a voltage $V_{FD}$. Before the transfer transistor is turned on, for example, before a time ($t_1$) in FIG. 4C, the reset transistor may cause the FD to reset. When the reset transistor receives a reset signal ($\Phi_{RS}$), the reset transistor causes the FD to reset, in other words, causes electrons to flow into the FD (source/drain region 224) to set the $V_{FD}$ to a predetermined voltage, such as $V_{RS}$. The reset voltage $V_{RS}$ may be $V_{dd}$. When the transfer transistor receives a transfer signal ($\Phi_{TG}$), transfer transistor is in an "on" state (between time ($t_1$) and time ($t_2$) in FIG. 4C) and transfers charge accumulated in the light-sensing region 214 to the FD (source/drain region 224). The FD node may be coupled to an additional storage capacitor for temporarily storing charges. The source-follower transistor is coupled between the $V_{dd}$ and the select transistor, and the source-follower transistor may be controlled by the FD (which is coupled with the source-follower transistor) during operation via a source-follower signal ($\Phi_{SF}$). A select signal ($\Phi_{SEL}$) may be applied to the select transistor to couple output of the sensor element 210 to the column output line. When the transfer transistor returns to an "off" state (after $t_2$ in FIG. 4C), during an integration period, the sensor element 210 receives light and accumulates photo-generated charge carriers (electrons) in the light-sensing region 214. A charge capacity of the light-sensing region 214 corresponds with a pinned potential ($V_{PIN}$), which is a highest applied voltage of the sensor element 210, and a voltage of the sensor element 210 is represented by $V_{PIX}$.

Figure 5A:
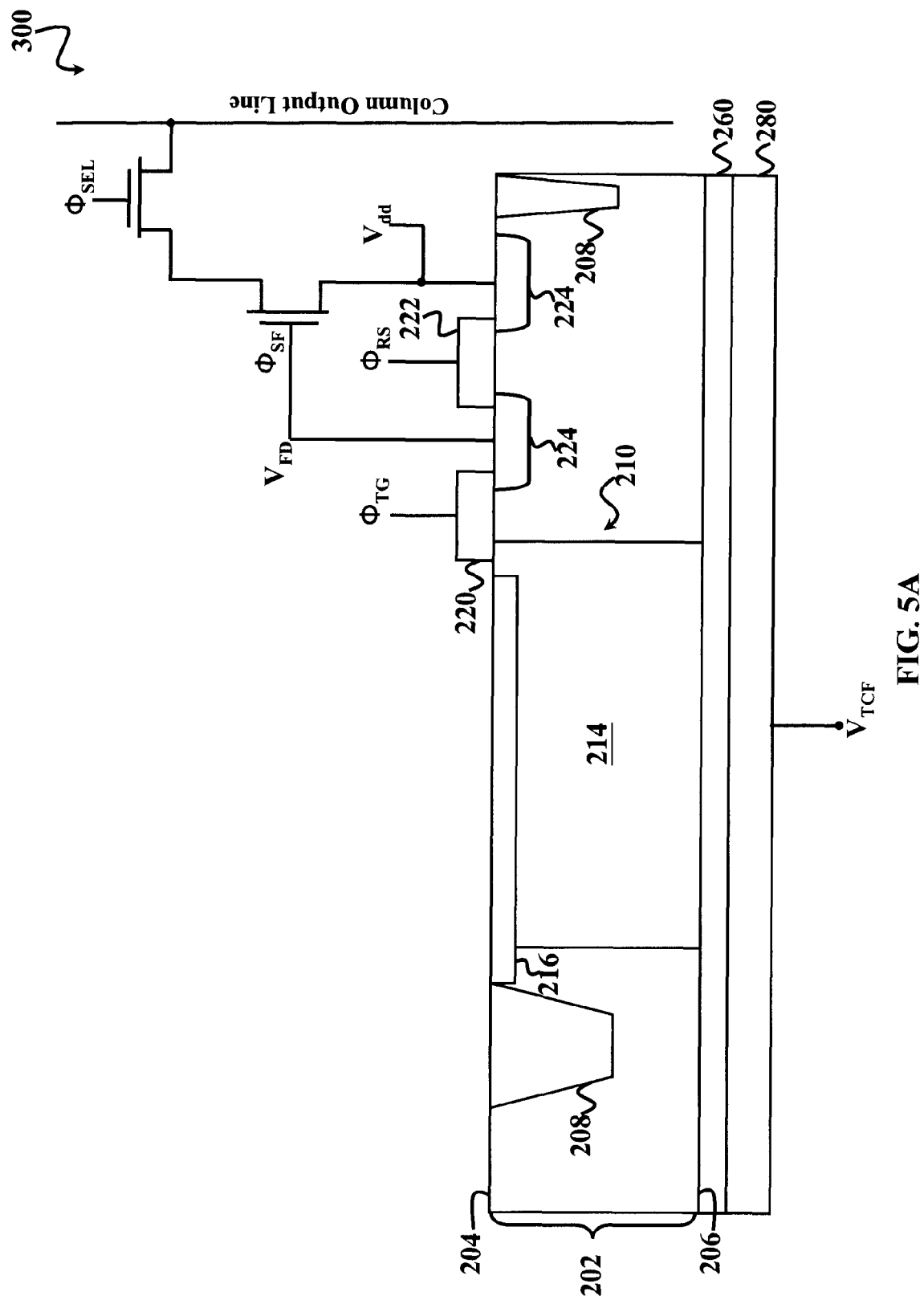
Figure 5B:
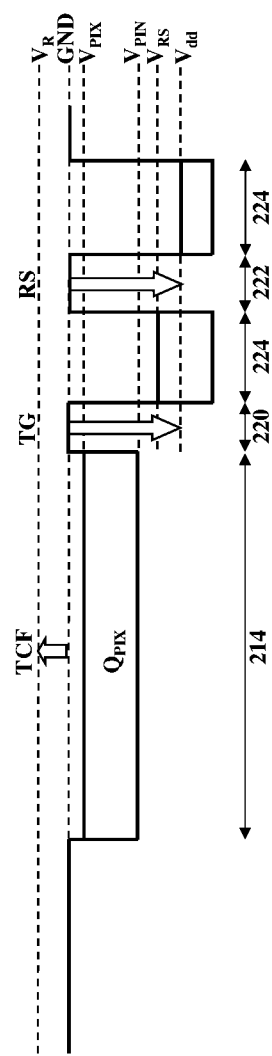
Figure 5C:
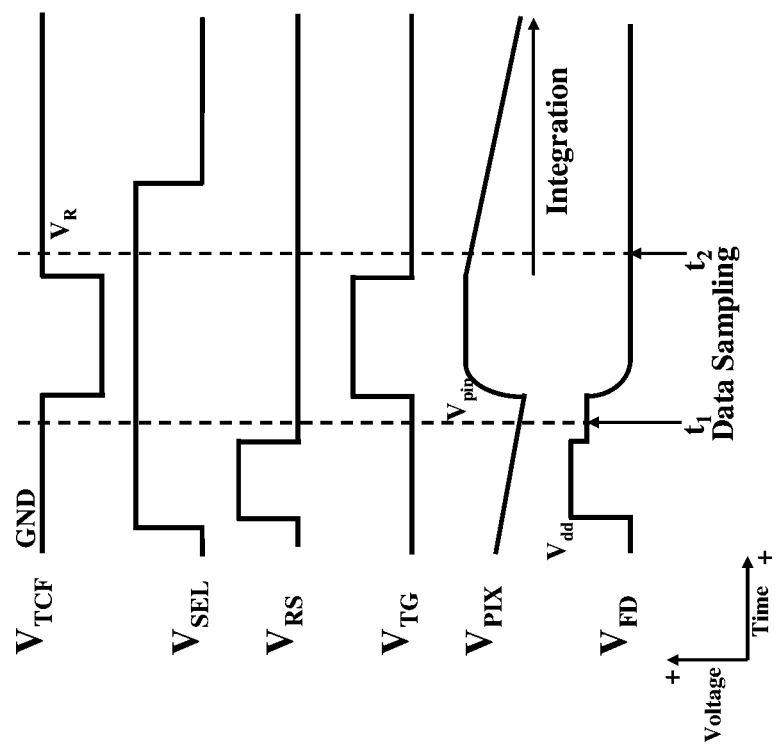

FIGS. 5A-5C illustrate another operation approach of the sensor element 210 of the integrated circuit device 300 where the transparent conductive layer 280 is biased. FIG. 5A is a hybrid diagrammatic sectional side view/circuit diagram of the integrated circuit device 300 according to various aspects of the present disclosure. FIG. 5B is a potential diagram of the sensor element 210 during an integration period (when the light-sensing region 214 is accumulating charge) when the transparent conductive layer 280 is biased during operation, and FIG. 5C is a timing diagram of the operation of the sensor element 210 when the transparent conductive layer 280 is biased during operation. The embodiment of FIGS. 4A-4C is similar in many respects to the embodiment of FIGS. 5A-5C except that the transparent conductive layer 280 is biased during operation. More specifically, the transparent conductive layer 280 is reverse biased when the transfer transistor is in an "on" state. The reverse biased transparent conductive layer 280 provides a stronger electric field, and therefore a stronger electric force on the accumulated charges in the light-sensing region 214 of the sensor element 210, thereby improving charge transfer when the transfer transistor is on.

Figure 6:
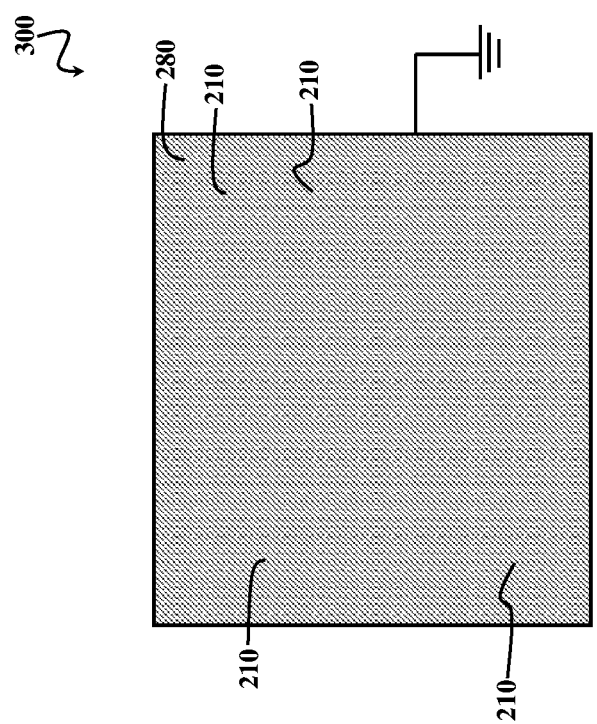
FIG. 6 and FIG. 7 are top views of the integrated circuit device of FIG. 3 according to various aspects of the present disclosure.

FIG. 6 provides a top view of the integrated circuit device 300 according to an embodiment of the present disclosure. In the top view, the integrated circuit device 300 includes sensor elements 210. The sensor elements 210 form a pixel array, such as the pixel array of FIG. 1, where each sensor element 210 is arranged into a column (for example, C1 to Cx) and a row (for example, R1 to Ry). In the depicted embodiment, the transparent conductive layer 280 covers the entire pixel array, and the transparent conductive layer 280 is grounded. Each sensor element 210 may thus operate as the sensor element 210 described with reference FIGS. 4A-4C.

Figure 7:
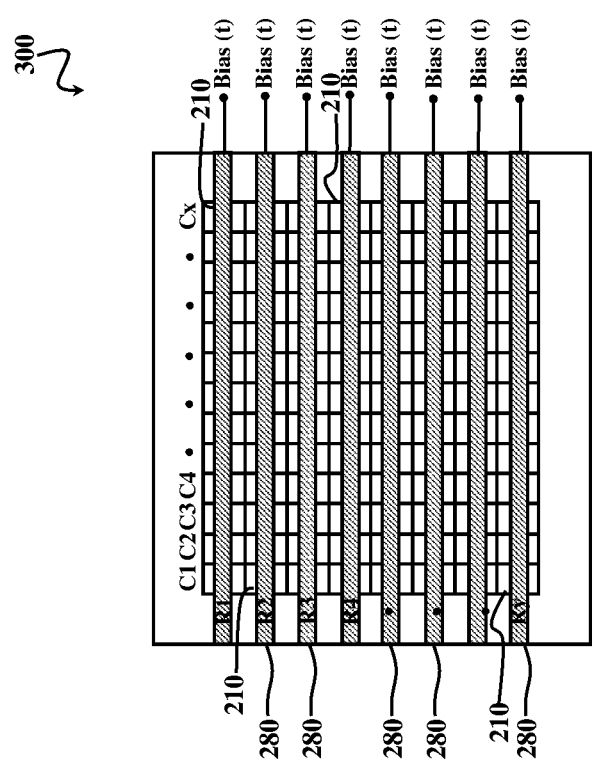

FIG. 7 provides a top view of the integrated circuit device 300 according another embodiment of the present disclosure. In the top view, the integrated circuit device 300 includes sensor elements 210. The sensor elements 210 form a pixel array, such as the pixel array of FIG. 1, where each sensor element 210 is arranged into a column (for example, C1 to Cx) and a row (for example, R1 to Ry). In the depicted embodiment, the transparent conductive layer 280 covers each row of the sensor elements 210. Accordingly, the transparent conductive layer 280 includes multiple layers, where each layer is disposed over a given row of sensor elements 210 in the pixel array. In furtherance of the depicted embodiment, the transparent conductive layer 280 in each row is biased at a given time (t). Each sensor element 210 may thus operate as the sensor element 210 described with reference FIGS. 5A-5C.

The present disclosure provides for many different embodiments. For example, an image sensor device includes a substrate having a front surface and a back surface; a sensor element disposed at the front surface of the substrate, the sensor element being operable to sense radiation projected toward the back surface of the substrate; and a transparent conductive layer disposed over the back surface of the substrate, the transparent conductive layer at least partially overlying the sensor element. The transparent conductive layer is configured for being electrically coupled to a bottom portion of the sensor element. In an example, the transparent conductive layer includes an indium tin oxide (ITO) material and/or indium gallium zinc oxide (IGZO) material. A dielectric layer may be disposed between the back surface of the substrate and the transparent conductive layer. The sensor element may include a light-sensing region of a first dopant type disposed in the substrate and a pinned layer of a second dopant type adjacent to the light-sensing region, the pinned layer being disposed at the front surface of the substrate. The first dopant type is opposite the second dopant type. In an example, the sensor element is free of another pinned layer of the second dopant type adjacent to the light-sensing region and disposed at the back surface of the substrate.

The image sensor device may further include a transfer transistor having a transfer gate disposed over the front surface of the substrate, wherein the transfer gate interposes a first source/drain region in the substrate and the sensor element; and a reset transistor having a reset gate disposed over the front surface of the substrate, wherein the reset gate interposes the first source/drain region in the substrate and a second source/drain region in the substrate. The image sensor device may further include a source-follower transistor having a source-follower gate, a first source-follower source/drain region, and a second source-follower source/drain region, wherein the source-follower gate is coupled with the first source/drain region and the first source-follower source/drain region is coupled with the second source/drain region; and a select transistor having a select source/drain region coupled with the second source-follower source/drain region. The image sensor device may further include a color filter disposed over the transparent conductive layer; and a lens disposed over the color filter, wherein the color filter and lens are aligned with a light sensing region of the sensor element.

In another example, an image sensor device includes a substrate having a front surface and a back surface; a pixel array including a plurality of pixels disposed at the front surface of the substrate, the pixel array being operable to sense radiation projected toward the back surface of the substrate; and a transparent conductive layer disposed over the back surface of the substrate, wherein the transparent conductive layer is capacitively coupled to the pixel array. In an example, the plurality of pixels are positioned in rows and columns, thereby forming the pixel array, and the transparent conductive layer is disposed over the pixel array. In another example, the plurality of pixels are positioned in rows and columns, thereby forming the pixel array, and the transparent conductive layer is disposed over each row of the pixel array.

Each pixel may include a photodiode and a transfer transistor, wherein the photodiode is configured to detect radiation and accumulate a signal charge in response to detecting radiation and the transfer transistor is configured to move the signal charge accumulated in the photodiode. Each pixel may further include a reset transistor, a source-follower transistor, and a select transistor The transparent conductive layer may include one of indium tin oxide (ITO) and indium gallium zinc oxide (IGZO). The image sensor device may include a dielectric layer disposed between the back surface of the substrate and the transparent conductive layer.

In yet another example, a method includes providing a substrate having a front surface and a back surface; forming a light sensing region at the front surface of the substrate; and forming a transparent conductive layer over the back surface of the substrate and at least partially overlying the sensor element, such that the transparent conductive layer is capacitively coupled with a bottom portion of the sensor element. The transparent conductive layer may include indium tin oxide (ITO) and/or indium gallium zinc oxide (IGZO). The method may further include forming a transfer gate over the front surface of the substrate, wherein the transfer gate interposes the light sensing region and a floating diffusion region in the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device comprising:
a substrate having a front surface and a back surface;
a sensor element disposed at the front surface of the substrate, the sensor element being operable to sense radiation projected toward the back surface of the substrate, wherein the sensor element includes a light-sensing region of a first dopant type disposed in the substrate and a pinned layer of a second dopant type adjacent to the light-sensing region, the pinned layer being disposed at the front surface of the substrate, wherein the first dopant type is opposite the second dopant type; and
a transparent conductive layer disposed over the back surface of the substrate, the transparent conductive layer at least partially overlying the sensor element and configured for being electrically coupled to a bottom portion of the sensor element.

2. The image sensor device of claim 1 wherein the transparent conductive layer includes an indium tin oxide (ITO) material.

3. The image sensor device of claim 1 wherein the transparent conductive layer includes an indium gallium zinc oxide (IGZO) material.

4. The image sensor device of claim 1 further comprising a dielectric layer disposed between the back surface of the substrate and the transparent conductive layer.

5. The image sensor device of claim 1 wherein the sensor element is free of another pinned layer of the second dopant type adjacent to the light-sensing region and disposed at the back surface of the substrate.

6. The image sensor device of claim 1 further comprising:
a transfer transistor having a transfer gate disposed over the front surface of the substrate, wherein the transfer gate interposes a first source/drain region in the substrate and the sensor element; and
a reset transistor having a reset gate disposed over the front surface of the substrate, wherein the reset gate interposes the first source/drain region in the substrate and a second source/drain region in the substrate.

7. The image sensor device of claim 6 further comprising:
a source-follower transistor having a source-follower gate, a first source-follower source/drain region, and a second source-follower source/drain region, wherein the source-follower gate is coupled with the first source/drain region and the first source-follower source/drain region is coupled with the second source/drain region; and
a select transistor having a select source/drain region coupled with the second source-follower source/drain region.

8. The image sensor device of claim 1 further comprising:
a color filter disposed over the transparent conductive layer; and
a microlens disposed over the color filter, wherein the color filter and microlens are aligned with a light sensing region of the sensor element.

9. An image sensor device comprising:
a substrate having a front surface and a back surface;
a pixel array including a plurality of pixels disposed at the front surface of the substrate, the pixel array being operable to sense radiation projected toward the back surface of the substrate, wherein at least one pixel from the plurality of pixels includes a light-sensing region of a first dopant type disposed in the substrate and a pinned layer of a second dopant type adjacent to the light-sensing region, the pinned layer being disposed at the front surface of the substrate, wherein the first dopant type is opposite the second dopant type; and
a transparent conductive layer disposed over the back surface of the substrate, wherein the transparent conductive layer is capacitively coupled to the pixel array.

10. The image sensor device of claim 9 wherein the plurality of pixels are positioned in rows and columns, thereby forming the pixel array, and the transparent conductive layer is disposed over the pixel array.

11. The image sensor device of claim 9 wherein the plurality of pixels are positioned in rows and columns, thereby forming the pixel array, and the transparent conductive layer is disposed over each row of the pixel array.

12. The image sensor device of claim 9 wherein each pixel includes a photodiode and a transfer transistor, wherein the photodiode is configured to detect radiation and accumulate a signal charge in response to detecting radiation and the transfer transistor is configured to move the signal charge accumulated in the photodiode.

13. The image sensor device of claim 12 wherein each pixel further includes a reset transistor, a source-follower transistor, and a select transistor.

14. The image sensor device of claim 9 further comprising a dielectric layer disposed between the back surface of the substrate and the transparent conductive layer.

15. The image sensor device of claim 9 wherein the transparent conductive layer includes one of indium tin oxide (ITO) and indium gallium zinc oxide (IGZO).

16. A method comprising:
 providing a substrate having a front surface and a back surface;
 forming a sensor element at the front surface of the substrate, wherein the sensor element includes a light-sensing region of a first dopant type disposed in the substrate and a pinned layer of a second dopant type adjacent to the light-sensing region, the pinned layer being disposed at the front surface of the substrate, wherein the first dopant type is opposite the second dopant type; and
 forming a transparent conductive layer over the back surface of the substrate and at least partially overlying the sensor element, such that the transparent conductive layer is capacitively coupled with a bottom portion of the sensor element.

17. The method of claim 16 wherein the forming the transparent conductive layer includes forming an indium tin oxide (ITO) layer.

18. The method of claim 16 wherein the forming the transparent conductive layer includes forming an indium gallium zinc oxide (IGZO) layer.

19. The method of claim 16 further comprising forming a transfer gate over the front surface of the substrate, wherein the transfer gate interposes the light sensing region and a floating diffusion region in the substrate.

20. The method of claim 16, wherein the sensor element is without any other pinned layer of the second dopant type interposed between the transparent conductive layer and the back surface of the substrate.

* * * * *